(12) United States Patent
Chun et al.

(10) Patent No.: US 11,211,364 B1
(45) Date of Patent: Dec. 28, 2021

(54) SEMICONDUCTOR DEVICE ASSEMBLIES AND SYSTEMS WITH IMPROVED THERMAL PERFORMANCE AND METHODS FOR MAKING THE SAME

(71) Applicant: Micron Technology, Inc., Boise, ID (US)

(72) Inventors: Hyunsuk Chun, Boise, ID (US); Xiaopeng Qu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/939,449

(22) Filed: Jul. 27, 2020

Related U.S. Application Data

(60) Provisional application No. 63/043,685, filed on Jun. 24, 2020.

(51) Int. Cl.
*H01L 29/40* (2006.01)
*H01L 25/065* (2006.01)
*H01L 23/31* (2006.01)
*H01L 25/00* (2006.01)
*H01L 21/56* (2006.01)
*H01L 23/373* (2006.01)

(52) U.S. Cl.
CPC .......... *H01L 25/0657* (2013.01); *H01L 21/56* (2013.01); *H01L 23/3128* (2013.01); *H01L 23/373* (2013.01); *H01L 25/50* (2013.01); *H01L 2225/06589* (2013.01)

(58) Field of Classification Search
CPC ................................................ H01L 2924/181
See application file for complete search history.

(56) References Cited

U.S. PATENT DOCUMENTS

| | | | | |
|---|---|---|---|---|
| 6,008,536 A * | 12/1999 | Mertol | .................. | H01L 23/367 257/704 |
| 6,229,702 B1 * | 5/2001 | Tao | ...................... | H01L 23/3675 165/80.2 |
| 6,359,341 B1 * | 3/2002 | Huang | ..................... | H01L 23/13 257/700 |
| 6,573,595 B1 * | 6/2003 | Chen | .................... | H01L 23/3128 257/698 |
| 2003/0057550 A1 * | 3/2003 | Zhao | ................. | H01L 23/49833 257/734 |
| 2003/0146511 A1 * | 8/2003 | Zhao | ................. | H01L 23/49816 257/739 |
| 2015/0303173 A1 * | 10/2015 | Maydar | ................... | H01L 24/46 257/664 |

* cited by examiner

*Primary Examiner* — Thao P Le
(74) *Attorney, Agent, or Firm* — Perkins Coie LLP (57) ABSTRACT

Semiconductor device assemblies are provided with one or more layers of thermally conductive material disposed between adjacent semiconductor dies in a vertical stack. The thermally conductive material can be configured to conduct heat generated by one or more of the semiconductor dies in laterally outward towards an outer edge of the assembly. The layer of thermally conductive material can comprise one or more allotropes of carbon, such as diamond, graphene, graphite, carbon nanotubes, or a combination thereof. The layer of thermally conductive material can be provided via deposition (e.g., sputtering, PVD, CVD, or ALD), or via adhering a film comprising the layer of thermally conductive material to one or more of the semiconductor dies.

20 Claims, 7 Drawing Sheets

SEMICONDUCTOR DEVICE ASSEMBLIES AND SYSTEMS WITH IMPROVED THERMAL PERFORMANCE AND METHODS FOR MAKING THE SAME

CROSS-REFERENCE TO RELATED APPLICATION

This application claims the benefit of U.S. Provisional Patent Application No. 63/043,685, filed on Jun. 24, 2020, which is incorporated by reference herein in its entirety.

TECHNICAL FIELD

The present disclosure generally relates to semiconductor devices, and more particularly relates to semiconductor device assemblies and systems with improved thermal performance and methods for making the same.

BACKGROUND

Packaged semiconductor dies, including memory chips, microprocessor chips, and imager chips, typically include one or more semiconductor dies mounted on a substrate and encased in a protective covering or capped with a heat-conducting lid. In operation, semiconductor dies can generate heat, which can pose a challenge for package design as the number of devices and the power density thereof increases. Various approaches to managing the generated heat include providing heat dissipating structures such as lids or heat sinks over the semiconductor dies to assist with heat exchange between the package and the environment in which it operates. Additional approaches to better manage heat generated by packaged semiconductor dies are desired.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Figure 1:
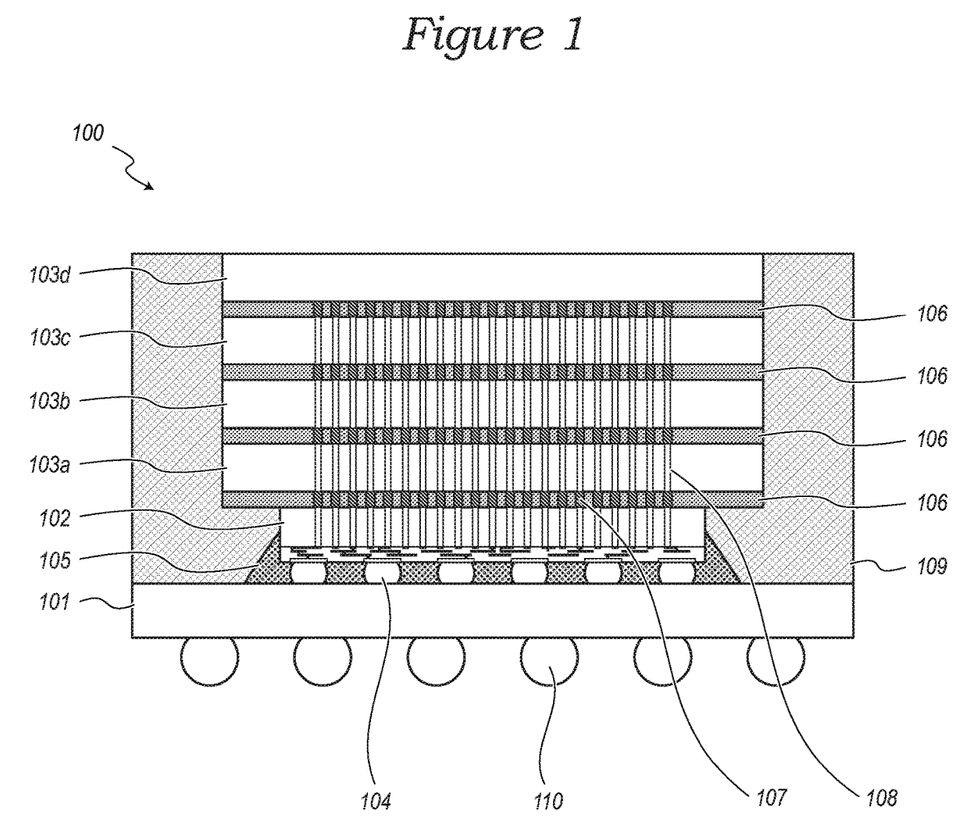
FIG. 1 is a simplified schematic cross-sectional view of a semiconductor device assembly.

FIG. 1 is a simplified schematic cross-sectional view of an exemplary semiconductor device assembly 100. The assembly 100 includes a package substrate 101 over which are disposed in a vertical stack a plurality of semiconductor dies. In the particular arrangement illustrated in FIG. 1, the stack includes a first semiconductor die 102 of a first type (e.g., a logic die) and four second semiconductor dies 103a-103d of a second type (e.g., memory dies). The first semiconductor die 102 can be electrically connected to the package substrate 101 by a plurality of solder balls 104 and an underfill material 105. Each of the four second semiconductor dies 103a-103d can be connected to a lower die in the stack by a die attach film 106 (e.g., a wafer-level non-conductive film (NCF) comprising any one of a variety of non-conductive polymers and/or b-staged epoxies) and electrically connected by a plurality of interconnects 107 and through-silicon vias (TSVs) 108. The stack of dies and package substrate can be at least partially encapsulated by an encapsulant material 109 (e.g., mold resin or the like). When integrated into a larger system, the assembly 100 may be connected by a plurality of package interconnects 110 (e.g., solder balls) to another device (e.g., system-level board).

In the assembly 100 of FIG. 1, the first semiconductor die 102 may generate significantly more heat during operation than the second semiconductor dies 103a-103d, due to the more power-intensive function fulfilled by a logic die. Although the second semiconductor die 102 may be capable of operating correctly at a high temperature that results from this generated heat, the second semiconductor dies 103a-103d, through which much of the heat generated by the first semiconductor die 102 flows, may not be capable of operating correctly at similarly high temperatures. Accordingly, to avoid unreliable operation, the first semiconductor die 102 may need to be operated more slowly to keep the second semiconductor dies 103a-103d operating within a specified temperature range.

To address this limitation, in the embodiments described below, semiconductor device assemblies can include one or more layers of thermally conductive material disposed between adjacent semiconductor dies in a vertical stack. The thermally conductive material can be configured to conduct heat generated by one or more of the semiconductor dies laterally outward towards an outer edge of the assembly. By conducting the heat laterally outward from between adjacent die toward an outer edge of the assembly, less of the heat generated in one die needs to be conducted through one or more adjacent dies (e.g., vertically through the stack), improving the thermal performance and reliability of the assembly.

Figure 2:
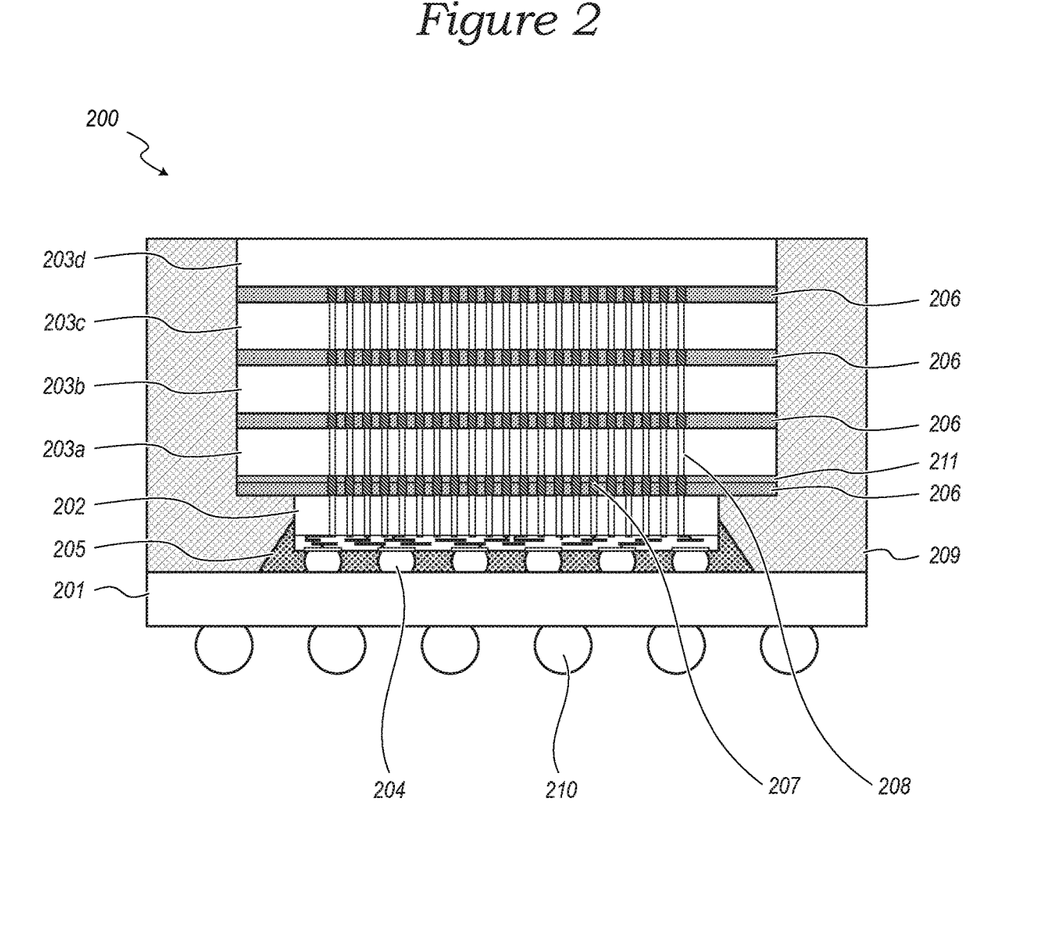
FIG. 2 is a simplified schematic cross-sectional view of a semiconductor device assembly in accordance with an embodiment of the present technology.

FIG. 2 is a simplified schematic cross-sectional view of a semiconductor device assembly in accordance with an embodiment of the present technology. The assembly 200 includes a package substrate 201 over which are disposed in a vertical stack a plurality of semiconductor dies. In the particular arrangement illustrated in FIG. 2, the stack includes a first semiconductor die 202 of a first type (e.g., a logic die) and four second semiconductor dies 203a-203d of a second type (e.g., memory dies). The first semiconductor die 202 can be electrically connected to the package substrate 201 by, e.g., a plurality of solder balls 204 and an underfill material 205. Each of the four second semiconductor dies 203a-203d can be connected to a lower die in the stack by, e.g., a die attach film 206 and electrically connected by a plurality of interconnects 207 and TSVs 208. The stack of dies and package substrate can be at least partially encapsulated by an encapsulant material 209 (e.g., mold resin or the like). When integrated into a larger system, the assembly 200 may be connected by a plurality of package interconnects 210 (e.g., solder balls) to another device (e.g., system-level board).

To improve the thermal performance of the assembly 200, a layer of thermally conductive material 211 is disposed between the first semiconductor die 202 and a lowermost one of the second semiconductor dies 203a. The thermally conductive material of the layer 211 can have a high thermal conductivity κ (e.g., more than 100 W/(m° K), more than 500 W/(m° K), more than 1,000 W/(m° K), or more than 1,500 W/(m° K)) in the x-y plane (e.g., perpendicular to the vertical stacking direction of the dies) to facilitate the conduction of heat (e.g., heat generated by one or more of the semiconductor dies) laterally outward (e.g., horizontally as depicted in FIG. 2) towards an edge of the stack of dies and towards an outer (e.g., vertical) surface of the assembly 200. The layer of thermally conductive material 211 can comprise one or more of a number of materials with the requisite thermal conductivity, including various allotropes of carbon, such as diamond (κ>2000 W/(m° K)), graphite (κ=150-400 W/(m° K)), graphene (a single layer of which enjoys a high κ of 1500-2500 W/(m° K) in the x-y direction and a low κ of 7-10 W/(m° K) in the z direction), ordered or disordered carbon nanotubes (κ=200-3500 W/(m° K)), or the like. In this regard, the layer of thermally conductive material 211 can have a thermal conductivity in the x- and y-dimensions that is significantly greater than a thermal conductivity in the z-dimension (e.g., more than 50% greater, more than 100% greater, or even multiple orders of magnitude greater). Alternatively, the layer of thermally conductive material 211 can comprise one or more of copper (κ=400 W/(m° K)), aluminum (κ=237 W/(m° K)), or the like.

In accordance with one aspect of the present disclosure, the layer of thermally conductive material 211 can have a thickness of between about 0.1 µm and 5 µm. Accordingly, the contribution of the layer of thermally conductive material 211 to the bond line thickness between adjacent dies and to the overall package height of the semiconductor device assembly 200 can be minimal. In other embodiments, the thickness of the layer of thermally conductive material can be greater or lesser than this range, depending upon the desired overall package height, the properties of the thermally conductive material used, and the amount of heat that the layer is configured to conduct laterally toward an outer edge of the assembly 200. For example, in some embodiments in which graphene is used as the thermally conductive material, the layer of thermally conductive material 211 can have a thickness of less than 0.1 µm and still conduct significant thermal energy in the x-y direction (e.g., radially outward from between adjacent dies). In other embodiments in which a material with a lower thermal conductivity κ, the thickness of the layer of thermally conductive material 211 can be greater than 5 µm (e.g., between about 5 µm and 10 µm, or between about 10 µm and 20 µm). In accordance with one aspect of the present disclosure, the thickness of a layer of thermally conductive material may correspond to its in-plane thermal conductivity (e.g.; thicker layers may be capable of greater heat conduction in an x-y plane than thinner layers).

According to one aspect of the present disclosure, the use of a thermally conductive material with a high κ in the x-y plane and a low κ in the z plane (e.g., where $\kappa_{x-y} \gg \kappa_z$) can provide a significant thermal advantage in preventing the vertical movement of heat in a stack of dies. In this regard, the preferential conduction of heat laterally rather than vertically of such a material can isolate, e.g., more temperature sensitive dies (such as memory die 203a) from dies that generate larger amounts of heat in operation (such as logic die 202), while still extracting heat generated by the hotter-running dies.

In one embodiment, the layer of thermally conductive material 211 can be provided on the backside of each of the dies 203a-203d in the stack while the dies are still in wafer form (e.g., in back-end processing). In this regard, for dies that include TSVs like those shown in FIG. 2, the layer of thermally conductive material 211 can be provided on the backside each die following a backside process that thins the wafer to reveal the TSVs from the backside (e.g., the lower surface of the dies 203a-203d). The layer of thermally conductive material 211 can be provided by any one of a number of deposition processes readily known to those skilled in the art, including sputtering, chemical vapor deposition (CVD), physical vapor deposition (PVD), atomic layer deposition (ALD), etc. Because backside processing is usually completed after the front-side fabrication of the active layer of a die (e.g.; formation of the semiconductor device structures therein), in some embodiments the deposition process can be constrained to a temperature sufficiently low to avoid causing heat-induced damage to the semiconductor device structures in the dies (e.g., at temperatures below about 300° C., or below about 250° C., or even below about 200° C.).

Figure 3:
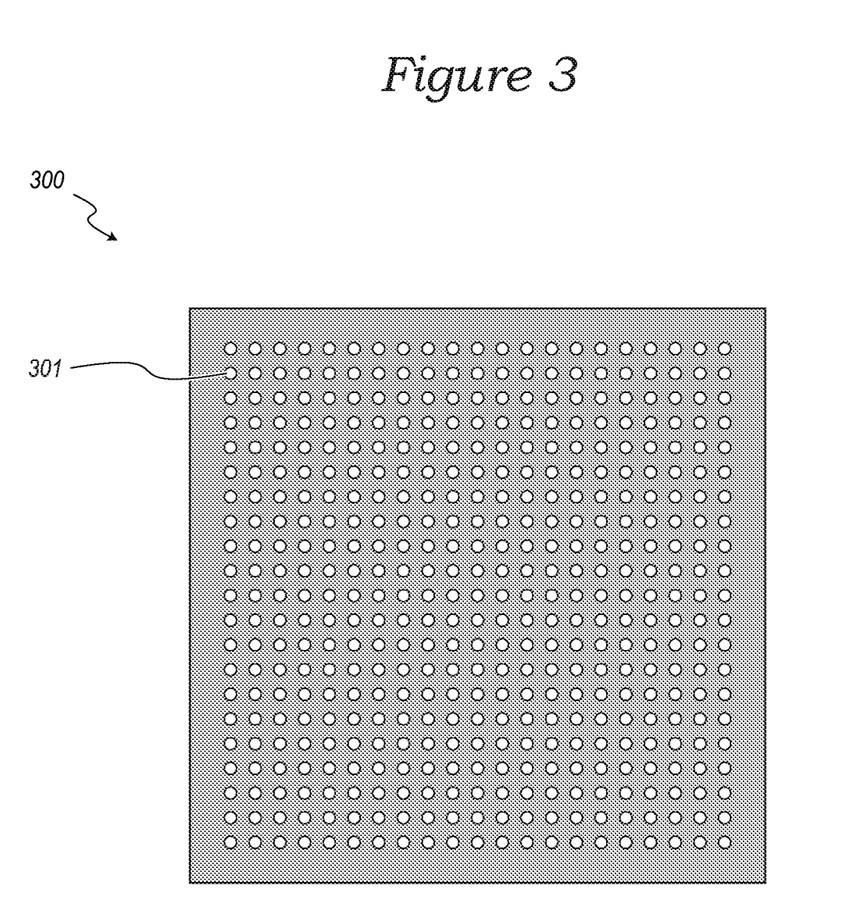
FIG. 3 is a simplified schematic overhead view of a layer of thermally conductive material in accordance with an embodiment of the present technology.

Because many thermally conductive materials are also electrically conductive, the layer of thermally conductive material 211 may be isolated from the interconnects 207 and TSVs 208. One approach to providing this isolation is illustrated in FIG. 3, which provides a simplified schematic overhead view of a layer of thermally conductive material in accordance with an embodiment of the present technology. As can be seen with reference to FIG. 3, the layer of thermally conductive material 300 includes a plurality of openings 301 with a shape, position and size corresponding to the interconnects of the dies between which it is to be disposed (e.g., the interconnects 207 of FIG. 2). The openings 301 can be formed with any one of a number of known semiconductor patterning and processing steps, such as photoresist masking and etching. For example, in an embodiment in which the layer of thermally conductive material 300 is deposited on the backside of the dies to be stacked in an assembly while the dies are still in wafer form, the deposition can include a mask patterning step that provides isolation structures (e.g., cured photoresist) surrounding each of the interconnects and/or revealed TSVs of the dies before the layer of thermally conductive material 300 is deposited, and a step after deposition of removing the isolation structures and the portions of thermally conductive material overlaying the same. In other embodiments, an isolation structure may comprise a material on which the thermally conductive material does not or cannot grow, such that the isolation structures can be left on the die surrounding (e.g.; at least the external lateral surfaces of) the interconnects.

In another embodiment, a layer of thermally conductive material can be provided in a pre-fabricated film (e.g., on a thin substrate of copper foil, silicon or silicon dioxide, on some other substrate or without any substrate at all) and applied to the underside of the dies, either in wafer form, or post-singulation but prior to stacking. In an embodiment in which the film (and optionally the substrate on which it is formed) are electrically conductive, the film can be patterned similarly to the layer of thermally conductive material 300 illustrated in FIG. 3, either after application to the backside of a wafer or a singulated die (e.g., by masking those areas of the film that are to remain, exposing those to be removed, etching away the exposed portions, and removing the mask), or prior to application (e.g., by providing openings in an un-patterned film with a mechanical cutting step, a laser cutting step, or the like; or via formation of a patterned film using the foregoing masking and patterning steps on a film growth substrate).

Although in the foregoing example embodiments, layers of thermally conductive material have been illustrated and described with openings to provide isolation from interconnects and/or TSVs, in other embodiments in which thermally conductive materials that are not electrically conductive are used, the foregoing patterning steps can be omitted, and a layer of thermally conductive material can be provided in direct contact with each of the interconnects without risking shorting or inadvertent charge movement between interconnects.

Figure 4:
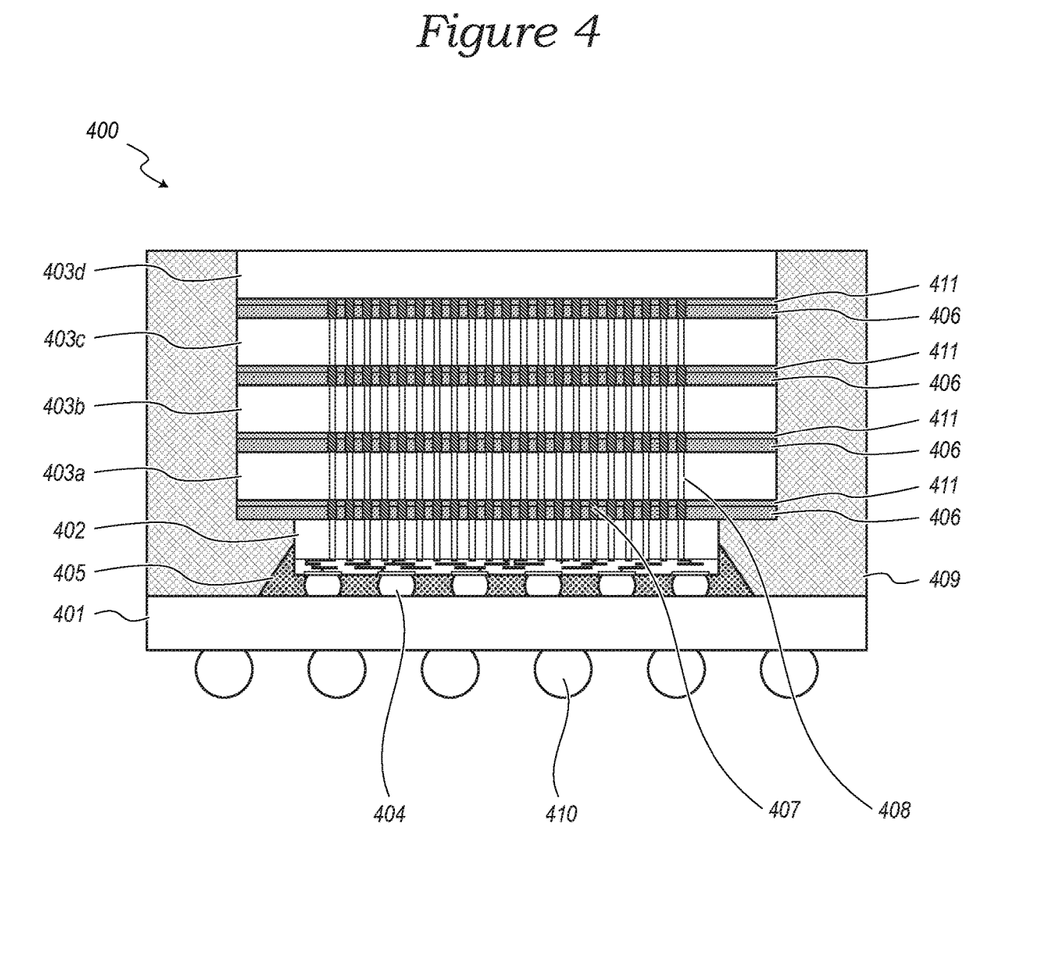
FIG. 4 is a simplified schematic cross-sectional view of a semiconductor device assembly in accordance with an embodiment of the present technology.

Although in the foregoing example embodiment semiconductor device assemblies have been illustrated and described in which a single layer of thermally conductive material has been provided between two adjacent die, in other embodiments semiconductor device assemblies can include additional layers of thermally conductive material. For example, FIG. 4 is a simplified schematic cross-sectional view of a semiconductor device assembly in accordance with an embodiment of the present technology. As can be seen with reference to FIG. 4, a semiconductor device assembly 400 includes a package substrate 401 over which are disposed in a vertical stack a plurality of semiconductor dies. In the particular arrangement illustrated in FIG. 4, the stack includes a first semiconductor die 402 of a first type (e.g., a logic die) and four second semiconductor dies 403a-403d of a second type (e.g., memory dies). The first semiconductor die 402 can be electrically connected to the package substrate 401 by, e.g., a plurality of solder balls 404 and an underfill material 405. Each of the four second semiconductor dies 403a-403d can be connected to a lower die in the stack by, e.g., a die attach film 406 and electrically connected by a plurality of interconnects 407 and TSVs 408. The stack of dies and package substrate can be at least partially encapsulated by an encapsulant material 409 (e.g., mold resin or the like). When integrated into a larger system, the assembly 400 may be connected by a plurality of package interconnects 410 (e.g., solder balls) to another device (e.g., system-level board).

To improve the thermal performance of the assembly 400, layers of thermally conductive material 411 are disposed between each pair of adjacent die in the stack (e.g., between the first semiconductor die 402 and a lowermost one of the second semiconductor dies 403a, between second semiconductor dies 403a and 403b, between second semiconductor dies 403b and 403c, and between second semiconductor dies 403c and 403d). As set forth above with reference to FIG. 2, the thermally conductive material of the layers 411 can have a high thermal conductivity κ to facilitate the conduction of heat laterally outward towards an edge of the stack of dies and towards an outer (e.g., vertical) surface of the assembly 400. In the arrangement of FIG. 4, the additional layers of thermally conductive material 411 can greatly increase the heat conducted laterally outward from between adjacent die without significantly increasing a thickness of the bond line between adjacent die and/or the overall height of the assembly 400.

Figure 5:
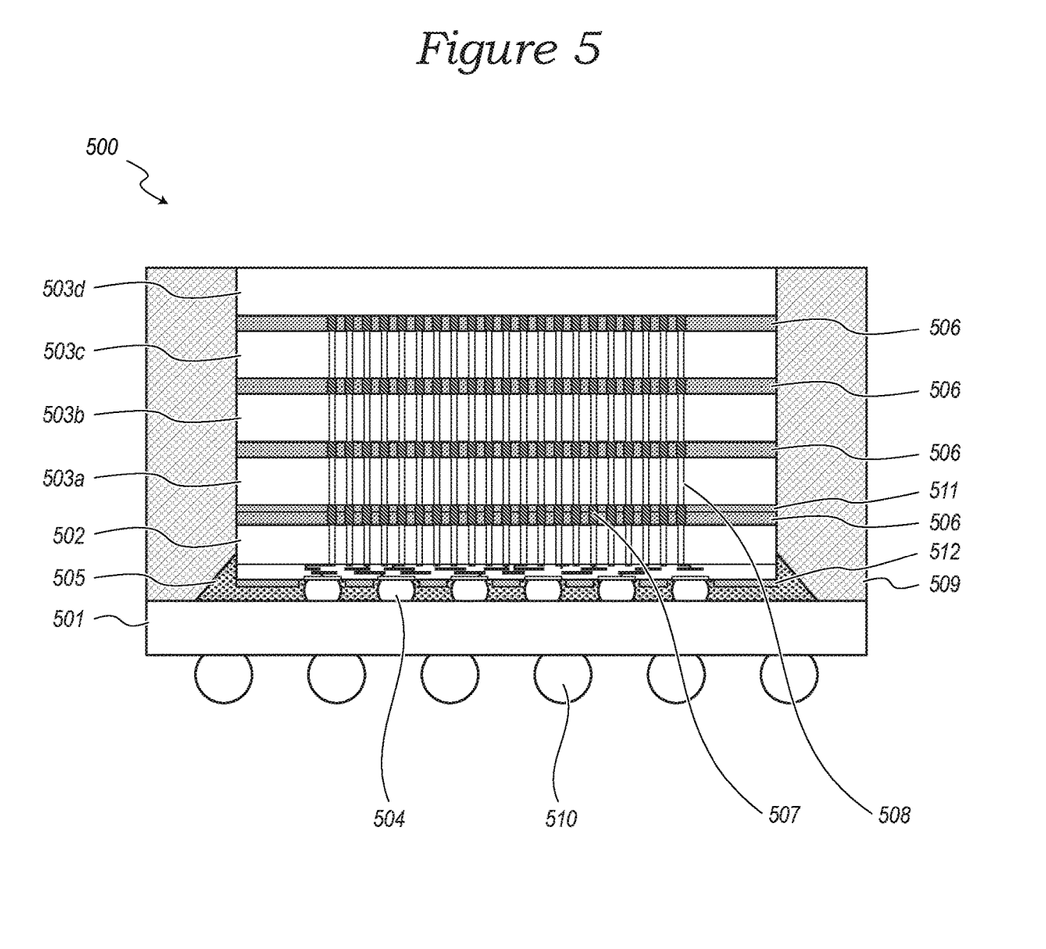
FIG. 5 is a simplified schematic cross-sectional view of a semiconductor device assembly in accordance with an embodiment of the present technology.

Although in the foregoing example embodiment semiconductor device assemblies have been illustrated and described in which dies of different plan areas are provided in a stack, such that a layer of thermally conductive material overhangs a smaller lower die in the stack, in other embodiments semiconductor device assemblies can include dies having a same plan area, or with larger dies below smaller dies. For example, FIG. 5 is a simplified schematic cross-sectional view of a semiconductor device assembly in accordance with an embodiment of the present technology. As can be seen with reference to FIG. 5, a semiconductor device assembly 500 includes a package substrate 501 over which are disposed in a vertical stack a plurality of semiconductor dies. In the particular arrangement illustrated in FIG. 5, the stack includes a first semiconductor die 502 of a first type (e.g., a logic die) and four second semiconductor dies 503a-503d of a second type (e.g., memory dies). Unlike the examples of FIGS. 2 and 4, the first semiconductor die 502 has a plan area substantially similar (e.g., within dimensional tolerances of 1%, or 5%, or 10%) to a plan area of the second semiconductor dies 503a-503d. The first semiconductor die 502 can be electrically connected to the package substrate 501 by, e.g., a plurality of solder balls 504 and an underfill material 505. Each of the four second semiconductor dies 503a-503d can be connected to a lower die in the stack by, e.g., a die attach film 506 and electrically connected by a plurality of interconnects 507 and TSVs 508. The stack of dies and package substrate can be at least partially encapsulated by an encapsulant material 509 (e.g., mold resin or the like). When integrated into a larger system, the assembly 500 may be connected by a plurality of package interconnects 510 (e.g., solder balls) to another device (e.g., system-level board).

To improve the thermal performance of the assembly 500, layers of thermally conductive material 511 are disposed between each pair of adjacent die in the stack (e.g., between the first semiconductor die 502 and a lowermost one of the second semiconductor dies 503a, between second semiconductor dies 503a and 503b, between second semiconductor dies 503b and 503c, and between second semiconductor dies 503c and 503d). Moreover, a layer of thermally conductive material 512 is also provided on a lower surface of the first semiconductor die 502, between the first semiconductor die 502 and the substrate 501. As set forth above with reference to FIG. 2, the thermally conductive material of the layers 511 and 512 can have a high thermal conductivity κ to facilitate the conduction of heat laterally outward towards an edge of the stack of dies and towards an outer (e.g., vertical) surface of the assembly 500. In the arrangement of FIG. 5, the additional layer of thermally conductive material 512 provided on a lower surface of the first semiconductor die 502 can further increase the heat conducted laterally outward from the die stack without significantly increasing a thickness of the bond line between adjacent die and/or the overall height of the assembly 500. Although the assembly 500 illustrated in FIG. 5 includes layers of thermally conductive material 511 between each adjacent pair of die in addition to a layer of thermally conductive material 512 on a lower surface of the first semiconductor die, in other embodiments the layers of thermally conductive material 511 could be omitted, such that only layer of thermally conductive material 512 is provided within the assembly.

Although the foregoing example embodiments have been illustrated and described with an encapsulant material separating the edges of the layers of thermally conductive material from an outer surface of the semiconductor device assemblies (which outer surface of the assembly is coextensive with an outer surface of the encapsulant) in other embodiments, other arrangements may be provided. For example, the amount of encapsulant may be reduced (e.g., such that a short distance separates an outer edge of the dies and of the layers of thermally conductive material from the outermost surface of the assembly) or even omitted. In other embodiments, the assembly may be provided with a thermally conductive lid over the top and/or around the sides of the assembly. Although stacks of dies have been illustrated and described as including TSVs and interconnects connecting adjacent dies, in other embodiments alternative arrangements for stacking die may similarly benefit from layers of thermally conductive material between adjacent die (e.g., wirebonded stacks of dies without TSVs or interconnects between adjacent dies, in which layers of thermally conductive materials can be provided without any openings, face-to-face die stacks, etc.).

In accordance with one aspect of the present disclosure, although the foregoing example embodiments have been illustrated and described with a layer of thermally conductive material provide on the back side of a die (e.g., during back side wafer processing, or post-singulation), in other embodiments of the present disclosure a layer of thermally conductive material could be provided on the front side of a die (e.g., after the completion of other front side processing steps, or between singulation and stacking). In one aspect, a layer of thermally conductive material could be provided on the front side of a die using deposition, optionally in combination with any one of a number of known semiconductor patterning and processing steps (e.g., photoresist masking, etching, etc.), analogously to the back side fabrication steps discussed in greater detail above.

Although the foregoing example embodiments have been illustrated and described with a single layer of thermally conductive material on a die, in other embodiments a die could be provided with multiple layers of thermally conductive material to increase the laterally-outward conduction of heat generated in an assembly. For example, in one embodiment, a die could be provide with a first layer of thermally conductive material on a front side thereof, and another layer of thermally conductive material on a back side thereof. The layers could each comprise the same material, or could include different materials (e.g., depending upon the various design constraints of total package height, bond line thickness, processing temperature limitations, etc.). In another embodiment, a die could include multiple stacked layers of thermally conductive material on a single side (e.g., on either the front side, the back side, or on both the front and back sides). The stack of thermally conductive layers could include multiple layers of the same material, or could be heterogenous stacks including multiple layers of different thermally conductive materials.

In accordance with one aspect of the present disclosure, although the foregoing example embodiments have been illustrated and described with reference to semiconductor device assemblies including multiple semiconductor dies and a substrate, in still other embodiments semiconductor device assemblies can include different arrangements. For example, a single device package (SDP) could include a single die disposed over a substrate, with a single layer of thermally conductive material disposed either between the die and the substrate, or over a side of the die opposing the substrate. In another embodiment, a substrate-free package could include multiple dies in a stack with one or more layers of thermally conductive material between adjacent dies. In still another embodiment, a substrate-free package with a single die (e.g., chip-scale packaging) could include a single die with one or more layers of thermally conductive material disposed thereon. In yet another embodiment, a discrete semiconductor died (e.g., not provided in a package) could be provided with one or more layers of thermally conductive material disposed thereon.

Figure 6:
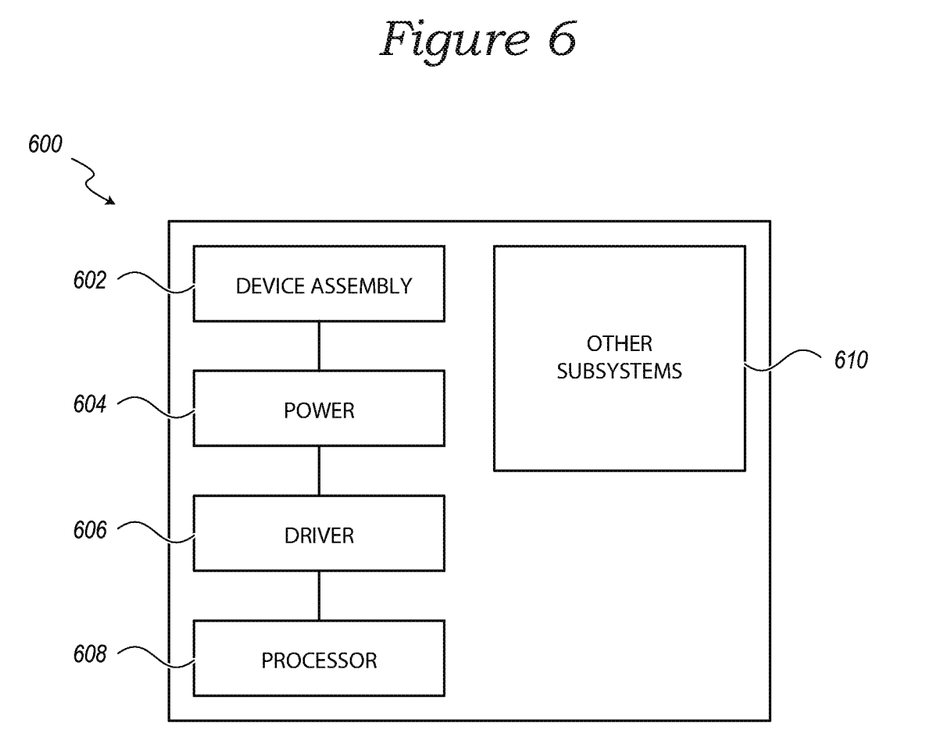
FIG. 6 is a schematic view showing a system that includes a semiconductor device assembly configured in accordance with an embodiment of the present technology.

Any one of the semiconductor devices and semiconductor device assemblies described above with reference to FIGS. 2-5 can be incorporated into any of a myriad of larger and/or more complex systems, a representative example of which is system 600 shown schematically in FIG. 6. The system 600 can include a semiconductor device assembly (e.g., or a discrete semiconductor device) 602, a power source 604, a driver 606, a processor 608, and/or other subsystems or components 610. The semiconductor device assembly 602 can include features generally similar to those of the semiconductor devices described above with reference to FIGS. 2-5. The resulting system 600 can perform any of a wide variety of functions, such as memory storage, data processing, and/or other suitable functions. Accordingly, representative systems 600 can include, without limitation, handheld devices (e.g., mobile phones, tablets, digital readers, and digital audio players), computers, vehicles, appliances and other products. Components of the system 600 may be housed in a single unit or distributed over multiple, interconnected units (e.g., through a communications network). The components of the system 600 can also include remote devices and any of a wide variety of computer readable media.

Figure 7:
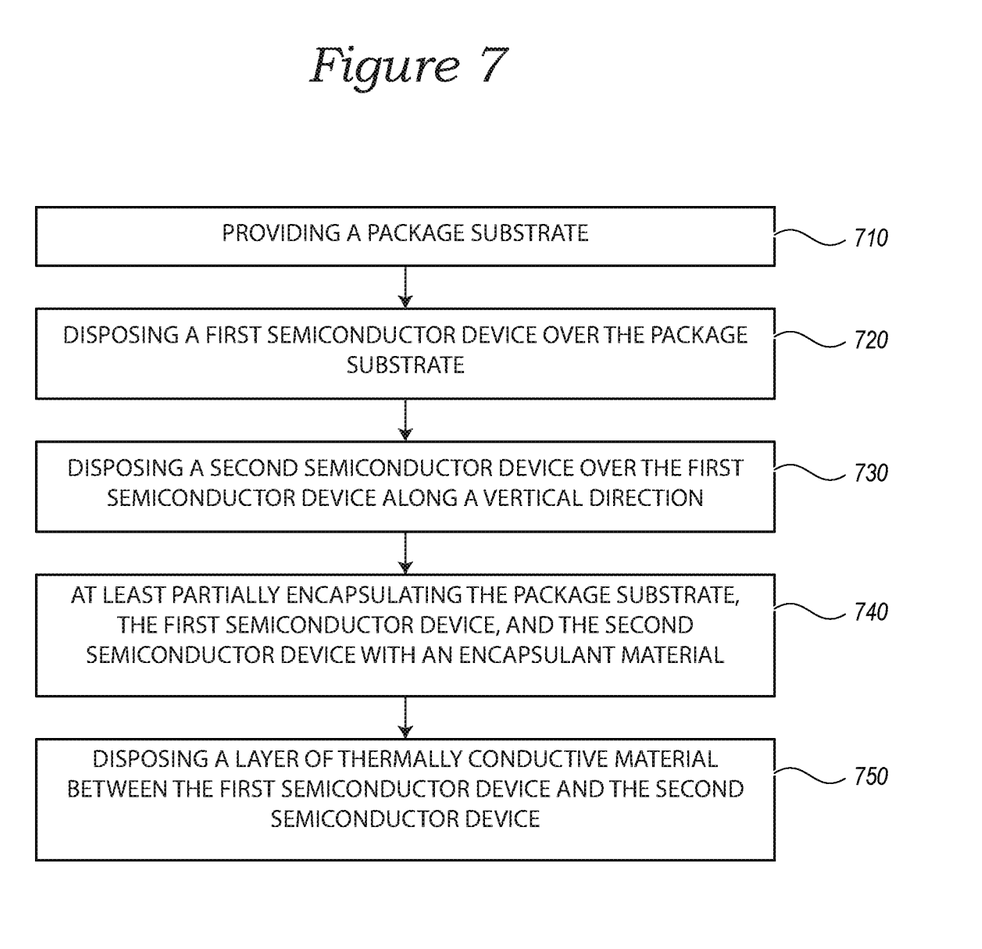
FIG. 7 is a flow chart illustrating a method of making a semiconductor device assembly in accordance with an embodiment of the present technology.

FIG. 7 is a flow chart illustrating a method of making a semiconductor device assembly. The method includes providing a package substrate (box 710), disposing a first semiconductor device over the package substrate (box 720), and disposing a second semiconductor device over the first semiconductor device along a vertical direction (box 730). The method further includes at least partially encapsulating the package substrate, the first semiconductor device, and the second semiconductor device with an encapsulant material (box 740). The method further includes disposing a layer of thermally conductive material between the first semiconductor device and the second semiconductor device (box 750). The layer of thermally conductive material can be configured to thermally conduct heat generated by the first semiconductor device laterally outward toward one or more outer surfaces of the encapsulant material that are parallel to the vertical direction.

According to one aspect, disposing the layer of thermally conductive material can comprise depositing the layer of thermally conductive material over a back side of the second semiconductor device by sputtering, physical vapor deposition (PVD), chemical vapor deposition (CVD), or atomic layer deposition (ALD). According to another aspect, disposing the layer of thermally conductive material can comprise adhering a film comprising the layer of thermally conductive material over a back side of the second semiconductor device. According to yet another aspect, disposing the layer of thermally conductive material comprises providing openings in the layer of thermally conductive material to electrically isolate interconnects disposed between the first semiconductor device and the second semiconductor device from the layer of thermally conductive material.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a package substrate;
   a first semiconductor device disposed over the package substrate, the first semiconductor device configured to generate heat during operation;
   a second semiconductor device disposed over the first semiconductor device along a vertical direction;
   an encapsulant material at least partially encapsulating the package substrate, the first semiconductor device, and the second semiconductor device, the encapsulant material having one or more outer surfaces parallel to the vertical direction; and
   a layer of thermally conductive material disposed between the first semiconductor device and the second semiconductor device, the layer of thermally conductive material configured to thermally conduct the heat generated by the first semiconductor device laterally outward toward the one or more outer surfaces.

2. The semiconductor device assembly of claim 1, wherein the layer of thermally conductive material is directly in contact with a back side of the second semiconductor device.

3. The semiconductor device assembly of claim 1, wherein the layer of thermally conductive material is directly in contact with a front side of the first semiconductor device.

4. The semiconductor device assembly of claim 1, wherein the layer of thermally conductive material is isolated from conductive interconnects disposed between and electrically connecting the first semiconductor device and the second semiconductor device.

5. The semiconductor device assembly of claim 1, wherein the layer of thermally conductive material comprises one or more allotropes of carbon.

6. The semiconductor device assembly of claim 1, wherein the layer of thermally conductive material comprises graphene, graphite, carbon nanotubes, or a combination thereof.

7. The semiconductor device assembly of claim 1, wherein the layer of thermally conductive material has a thermal conductivity $\kappa$ of greater than 500 W/(m° K).

8. The semiconductor device assembly of claim 1, wherein the layer of thermally conductive material has a thickness of between 0.1 µm and 5 µm.

9. The semiconductor device assembly of claim 1, wherein the layer of thermally conductive material has a plan area substantially similar to the first semiconductor device, the second semiconductor device, or both.

10. A method of making a semiconductor device assembly, comprising:
    providing a package substrate;
    disposing a first semiconductor device over the package substrate, the first semiconductor device configured to generate heat during operation;
    disposing a second semiconductor device over the first semiconductor device along a vertical direction;
    at least partially encapsulating the package substrate, the first semiconductor device, and the second semiconductor device with an encapsulant material, the encapsulant material having one or more outer surfaces parallel to the vertical direction; and
    disposing a layer of thermally conductive material between the first semiconductor device and the second semiconductor device, the layer of thermally conductive material configured to thermally conduct the heat generated by the first semiconductor device laterally outward toward the one or more outer surfaces.

11. The method of claim 10, wherein disposing the layer of thermally conductive material comprises depositing the layer of thermally conductive material over a back side of the second semiconductor device by sputtering, physical vapor deposition (PVD), chemical vapor deposition (CVD), or atomic layer deposition (ALD).

12. The method of claim 10, wherein disposing the layer of thermally conductive material comprises adhering a film comprising the layer of thermally conductive material over a back side of the second semiconductor device.

13. The method of claim 10, wherein the layer of thermally conductive material comprises graphene, graphite, carbon nanotubes, or a combination thereof.

14. The method of claim 10, wherein the layer of thermally conductive material has a thermal conductivity κ of greater than 500 W/(m° K).

15. The method of claim 10, wherein the layer of thermally conductive material has a thickness of between 0.1 μm and 5 μm.

16. The method of claim 10, wherein disposing the layer of thermally conductive material comprises providing openings in the layer of thermally conductive material to electrically isolate interconnects disposed between the first semiconductor device and the second semiconductor device from the layer of thermally conductive material.

17. A semiconductor device assembly, comprising:
a package substrate;
at least one semiconductor device disposed over the package substrate, the at least one semiconductor device having a front side and a back side, the at least one semiconductor device configured to generate heat during operation; and
a layer of thermally conductive material disposed immediately adjacent one of the front side or the back side, the layer of thermally conductive material configured to thermally conduct the heat generated by the at least one semiconductor device laterally outward toward one or more outer vertical surfaces of the semiconductor device assembly.

18. The semiconductor device assembly of claim 17, wherein the layer of thermally conductive material is disposed between the at least one semiconductor device and the package substrate.

19. The semiconductor device assembly of claim 17, wherein the at least one semiconductor device includes two semiconductor devices, and wherein the layer of thermally conductive material is disposed between the two semiconductor devices.

20. The semiconductor device assembly of claim 17, wherein the layer of thermally conductive material comprises graphene, graphite, carbon nanotubes, or a combination thereof.

* * * * *